(12) United States Patent
Brantl et al.

(10) Patent No.: US 9,553,574 B2
(45) Date of Patent: Jan. 24, 2017

(54) SOLID STATE POWER CONTROLLER

(71) Applicant: Hamilton Sundstrand Corporation, Windsor Locks, CT (US)

(72) Inventors: Peter Brantl, Fremdingen (DE); Fritz Lammerer, Rosenheim (DE); Rainer J. Seidel, Tussenhausen (DE); Matthias Maier, Wallerstein (DE)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 0 days.

(21) Appl. No.: 14/718,280

(22) Filed: May 21, 2015

(65) Prior Publication Data

US 2016/0028392 A1 Jan. 28, 2016

(30) Foreign Application Priority Data

Jul. 23, 2014 (DE) .......................... 10 2014 110 406

(51) Int. Cl.
| | |
|---|---|
| H05B 33/08 | (2006.01) |
| H03K 17/16 | (2006.01) |
| H02H 9/04 | (2006.01) |
| H03K 17/082 | (2006.01) |
| H03K 17/12 | (2006.01) |

(52) U.S. Cl.
CPC ............ *H03K 17/167* (2013.01); *H02H 9/041* (2013.01); *H03K 17/0822* (2013.01); *H03K 17/122* (2013.01); *H03K 17/165* (2013.01)

(58) Field of Classification Search
CPC ....... H05B 37/02; H05B 33/08; H05B 33/083; H05B 33/0815; H05B 33/0824; H03K 17/167; H03K 17/165; H03K 17/0822; H03K 17/122
USPC ... 315/185 R, 186, 193, 291, 293, 307, 308; 327/365, 380, 440, 424, 442, 595
See application file for complete search history.

(56) References Cited

U.S. PATENT DOCUMENTS

| | | | |
|---|---|---|---|
| 2012/0229037 A1* | 9/2012 | Moskowitz | .......... H05B 33/083 315/192 |
| 2013/0307514 A1* | 11/2013 | O'Connell | ......... H03K 17/6874 323/312 |
| 2014/0265894 A1* | 9/2014 | Weaver | ................ H05B 33/083 315/193 |

* cited by examiner

*Primary Examiner* — Thai Pham
(74) *Attorney, Agent, or Firm* — Cantor Colburn LLP

(57) ABSTRACT

A solid state power controller including: a plurality of pairs of FETs connected in parallel, each pair comprising a first, forward-facing FET and a second, backward-facing FET connected by their respective sources; gate drive means for switching said FETs on and off; and means for isolating the sources of the backwards-facing FETs of the plurality of pairs of FETs from each other and operating the backwards-facing FETs in $3^{rd}$ quadrant operation mode.

4 Claims, 2 Drawing Sheets

SOLID STATE POWER CONTROLLER

FOREIGN PRIORITY

This application claims priority to German Patent Application No. 10 2014 110 406.4 filed Jul. 23, 2014, the entire contents of which is incorporated herein by reference.

TECHNICAL FIELD

The present case is concerned with solid state power controllers (SSPCs).

BACKGROUND

Vehicles, such as aircraft, typically utilise one or more power distribution units to distribute power from a primary power source to various vehicle systems. The solid state power controls in a power distribution unit typically include an electronic switch, such as a FET, and electronic circuitry that provides wiring protection. The FET and circuitry are often referred to as a solid state power controller ("SSPC"). The SSPC has found widespread use because of its desirable status capability, reliability, and packaging density. The Solid State Power Controller (SSPC) is gaining acceptance as a modern alternative to the combination of conventional electromechanical relays and circuit breakers for commercial aircraft power distribution due to its high reliability, "soft" switching characteristics, fast response time, and ability to facilitate advanced load management and other aircraft functions.

While SSPCs with current rating under 15 A have been widely utilised in aircraft secondary distribution systems, power dissipation, voltage drop, and leakage current associated with solid state power switching devices pose challenges for using SSPCs in high voltage applications of aircraft primary distribution systems with higher current ratings.

A typical SSPC generally comprises a solid state switching device (SSSD), which performs the primary power on/off switching, and a processing engine, which is responsible for SSSD on/off control and a feeder wire protection. A typical power distribution unit may include hundreds or thousands of SSPCs.

Solid State Power Controllers are used to switch and regulate current on ohmic, capacitive and inductive loads.

They are also used to absorb inductive energy when switching an inductive load "OFF". This is done by limiting the voltage over the SSPC ("clamping") to a specific constant voltage level (clamping voltage) while discharging the load inductance, using the SSPCs linear mode.

In existing SSPC circuits all parallel FETs are directly connected together with their drains and sources. Existing aircraft applications employ exclusively a metal oxide semiconductor field effect transistor (MOSFET) as a basic solid state component for building up the SSSD. This features easy control, bi-directional conduction characteristics, has a resistive conduction nature, and has a positive temperature coefficient. To increase the current carrying capability and reduce the voltage drop or power dissipation, the standard SSSD comprises multiple MOSFETs generally connected in parallel. An example is shown in FIG. 1 using parallel-connected MOSFETs.

When switching an inductive load "OFF", all paralleled FETs operate in linear mode for a short time (depending on the load, inductive energy, clamping voltage) to absorb the energy from the inductance of the load that has been switched off. The switches are protected by a so-called clamping mode, which involves setting the voltage over the SSPC at a specific maximum voltage level, and using linear mode to absorb the energy that is stored in the inductance.

As not all FETs have the same gate threshold voltage Vth because of process and production variations, current is shared very unequally between FETs in this conventional linear mode.

The problem in such applications is to really control the current or energy sharing over the paralleled solid state devices equally. This problem occurs during linear mode operation during switch off of an inductive load. Generally, during SSSD turn-off transients, all of the MOSFETsn do not turn off simultaneously, nor does the current distribute evenly among the MOSFETs in such a short time.

This is specifically true for FETs that have a very steep transfer characteristic like many Si MOSFETs that are optimised for pure switching On/Off applications.

This imbalance in linear mode gets worse after a few μs because the hottest FET will take even more current, because the gate threshold voltage Vth of a FET drops with increasing temperature. Because all FETs see the same Vgs voltage from the gate driver, a single FET with lower Vth will take much more current.

This leads to a mechanism in linear mode where the FET that is already the hottest will take the largest amount of current, thus leading to uneven current distribution.

There is no mechanism in linear mode that works against such an imbalance.

The result is that some FETs in a paralleled FET array get much hotter than the rest. Energy sharing variation amongst the FETs can be 100% and more. Therefore, the likelihood of destroying a single FET in a paralleled array is very high, even if the operated pulsed energy average is in the middle of the SOA area (theoretical average energy per FET of a FET array).

This fact raises the costs in SSPC design because it is necessary to design a very high safety margin into the SSPC to make sure that the FET with the lowest Vth is not destroyed. A destroyed FET in an SSPC causes in most cases a short circuit between its G-D-S connections, which makes the whole SSPC unusable. If the FET is mounted in "Chip On Board" technology, it is also not repairable.

Because of the goal for an SSPC to achieve the lowest possible voltage drop, it is not an option to add additional resistors at the MOSFET sources in the way it would be implemented in a conventional current feedback design for discrete FETs of current amplifiers for example.

In an SSPC capable of operating in AC conditions, because of the FETs inherent body diode, FETs are needed that are directed towards both current directions, to be able to interrupt AC current.

It is desirable to have an SSPC design in which the current can be more controlled and more evenly distributed between FETs when an inductive load is switched off.

SUMMARY

Accordingly, the present invention provides a solid state power controller comprising a plurality of pairs of FETs connected in parallel, each pair comprising a first, forward-facing FET and a second, backward-facing FET connected by their respective sources; gate drive means for switching said FETs on and off; and means for isolating the sources of the backwards-facing FETs of the plurality of pairs of FETs from each other and operating the backwards-facing FETs in 3rd quadrant operation mode.

The source potentials of the lower-end or backwards-facing FETs are discrete or isolated from each other so these FETs can act as emitter resistors or variable source resistors to provide current feedback. The system can therefore optimise how current is distributed between FETs on load switch-off.

BRIEF DESCRIPTION OF THE DRAWINGS

Preferred embodiments will now be described, by way of example only, with reference to the drawings.

DETAILED DESCRIPTION

The standard SSPC has been described above, with reference to the invention.

The "reverse FET" of the present SSPC (depends on the current direction) gives us the opportunity in SSPCs to use the reverse or backwards-facing FET as an "adjustable source resistor" if it is operating in its third quadrant.

In order to prevent current imbalance because of the Vth variations, a "feedback resistor" (the already existing low, or backwards-facing side FET working in its third quadrant mode) is implemented for every FET between the FET's SOURCE potential and the LOAD output. This "Resistor" reduces the actual Vgs proportional to the current.

If one transistor-resistor path is carrying more dI current than others, the gate voltage at this transistor will be reduced by the amount of "dUcorrection":

$$dU\ correction = dI(Fet) * R(Resistor\ feedback)$$

$$U\ correction = I(Fet) * R(Resistance\ of\ feedback\ resistor) - I(average/Fet) * R(Resistance\ of\ feedback\ resistor).$$

Therefore the Fets "n*SOURCEs" cannot be directly connected, in order to enable individual current-to-voltage feedback from the implemented individual n*feedback "resistors".

This is done by separating the Fet "n*SOURCEs" from each other, and creating "n*discrete sources".

A virtual "COMMON SOURCE" is created only for the purpose of being able to use a single gate driver for all paralleled n*FETs.

The "discrete source" potentials [n*] are connected via "high impedance" >1 Ohm [n*]resistors to the "COMMON SOURCE".

This does not corrupt the functionality of the [n*] source path "resistors" (SPICE parts M3-M5), as it is not attractive for a current dI to use a path>1 Ohm if a path with 25-80 mOhm is available.

Figure 1:
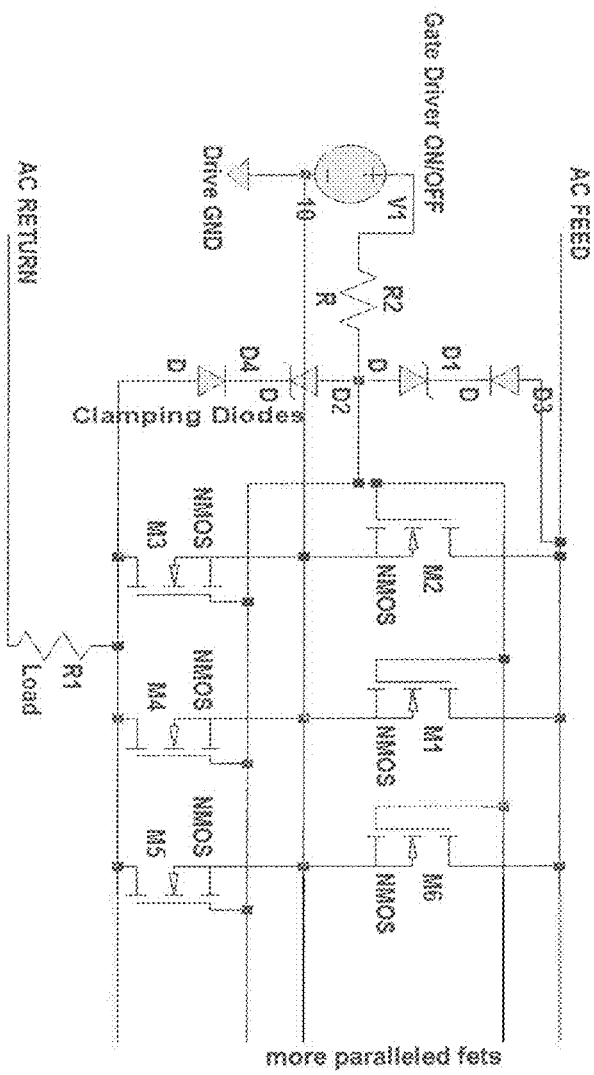
FIG. 1 is a simplified circuit diagram of a standard, parallel FET, SSPC.
Figure 2:
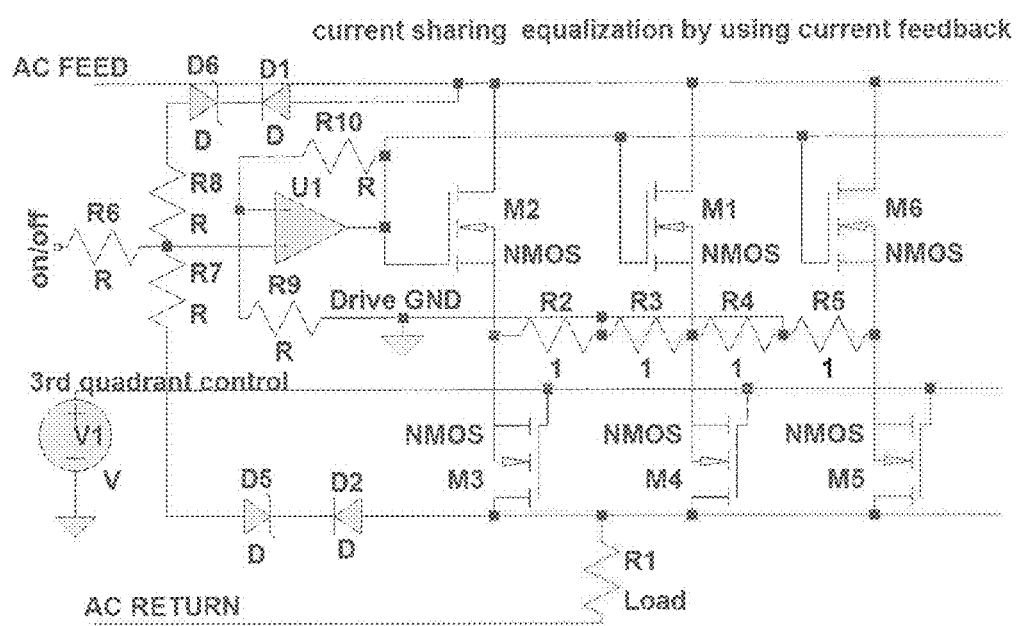
FIG. 2 is a simplified circuit diagram of an SSPC according to the present invention.

As can be seen in FIG. 2, the backwards FET (M3, M4 and M5) is used in the third quadrant operation mode. The 3rd quadrant control voltage is supplied by the gate driver.

In one embodiment, an IC logic (FPGA) controls if the upper (forward) or the lower (backward) FET array is controlled for 3rd quadrant operation mode, depending on the sensed current flow direction at the beginning of a SSPC "switch off" operation.

A non IC solution is also feasible, such as using "NAND" circuits to allow 3rd quadrant control for the FETs which do not get any voltage via the clamping diodes.

It is preferred to apply the Vgs which results in the largest differential resistance. Of course the maximum possible absolute 3rd quadrant voltage drop Vsd is limited by the transfer function of the FET's inherent body diode.

The maximum achievable differential resistance depends therefore on the device 3rd quadrant characteristic and mainly on the induced current level.

Current feedback is thus performed by the backwards FETs working as emitter resistors for the other FETs working in linear mode (clamping) by raising their source potential compared to their gate potential. This is made possible by creating "discrete sources" for the backwards FETs e.g. using resistors for decoupling.

The SSPC, therefore, enables current to be more evenly distributed between FETs when an inductive load is switched OFF.

The invention claimed is:

1. A solid state power controller comprising:
a plurality of pairs of FETs connected in parallel, each pair comprising a first, forward-facing FET and a second, backward-facing FET connected by their respective sources;
gate drive means for switching said FETs on and off; and
means for isolating the sources of the backwards-facing FETs of the plurality of pairs of FETs from each other;
wherein the gate drive means causes the backwards-facing FETs to operate in $3^{rd}$ quadrant operation mode.

2. The solid state power controller of claim 1 wherein pairs of FETs are connected via the drains of the FETs of the respective pairs.

3. The solid state power controller of claim 1, whereby the means for isolating the sources comprises a resistor between sources of respective FETs and the gate drive means.

4. The solid state power controller of claim 1, comprising an operational amplifier for controlling an on/off status of the FETs and for controlling the clamping voltage.

* * * * *